(12) United States Patent
Lee et al.

(10) Patent No.: US 12,165,600 B2
(45) Date of Patent: Dec. 10, 2024

(54) DISPLAY DEVICE

(71) Applicant: Samsung Display Co., LTD., Yongin-si (KR)

(72) Inventors: Dong-Hoon Lee, Yongin-si (KR); Haemin Kim, Yongin-si (KR); Youngwan Seo, Yongin-si (KR); Geunho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/453,115

(22) Filed: Aug. 21, 2023

(65) Prior Publication Data

US 2024/0233653 A1    Jul. 11, 2024

(30) Foreign Application Priority Data

Jan. 6, 2023 (KR) .................. 10-2023-0002426

(51) Int. Cl.
  *G09G 3/30* (2006.01)
  *G09G 3/3275* (2016.01)
  *H10K 59/131* (2023.01)
  *H10K 77/10* (2023.01)

(52) U.S. Cl.
  CPC ....... *G09G 3/3275* (2013.01); *H10K 59/1315* (2023.02); *H10K 77/111* (2023.02); *G09G 2310/0272* (2013.01)

(58) Field of Classification Search
  None
  See application file for complete search history.

(56) References Cited

U.S. PATENT DOCUMENTS

| | | | |
|---|---|---|---|
| 2022/0123087 A1* | 4/2022 | Yu ........................ | G09G 3/3225 |
| 2023/0040448 A1* | 2/2023 | Zhang ..................... | G09F 9/30 |
| 2023/0112912 A1* | 4/2023 | Qing .................... | G09G 3/3208 |
| | | | 345/204 |

FOREIGN PATENT DOCUMENTS

| | | |
|---|---|---|
| KR | 10-2019-0032711 A | 3/2019 |
| KR | 10-2020-0078806 A | 7/2020 |
| KR | 10-2022-0079760 A | 6/2022 |
| KR | 10-2022-0092134 A | 7/2022 |

* cited by examiner

*Primary Examiner* — Joseph R Haley
(74) *Attorney, Agent, or Firm* — Lewis Roca Rothgerber Christie LLP

(57) ABSTRACT

A display device includes a substrate including a display area, a first peripheral area, a second peripheral area, and a bending area, a data distributor in the second peripheral area, a data driver in the second peripheral area, first data connection line groups including first data connection lines connected to the data distributor and receiving a data signal output from the data driver in response to a first distribution selection signal, second data connection line groups including second data connection lines connected to the data distributor and receiving the data signal in response to a second distribution selection signal, first power connection lines positioned between one of the first data connection line groups and one of the second data connection line groups and second power connection lines positioned between one of the first data connection line groups and one of the second data connection line groups.

28 Claims, 12 Drawing Sheets

PA:PA1,PA2,BA

DISPLAY DEVICE

CROSS-REFERENCED TO RELATED APPLICATION

The present application claims priority to and the benefit of Korean Patent Application No. 10-2023-0002426, filed on Jan. 6, 2023, in the Korean Intellectual Property Office, the entire content of which is incorporated herein by reference.

BACKGROUND

1. Field

Aspects of some embodiments of the present disclosure relate to a display device.

2. Description of the Related Art

As information technology develops, the importance of display devices providing a connection medium between users and information is being highlighted. For example, the use of display devices such as a liquid crystal display device (LCD), an organic light emitting display device (OLED), a plasma display device (PDP), and a quantum dot display device is increasing.

Display devices generally have a display area where pixels are located and a peripheral area surrounding the display area. Research to reduce the peripheral area is ongoing.

The above information disclosed in this Background section is only for enhancement of understanding of the background and therefore the information discussed in this Background section does not necessarily constitute prior art.

SUMMARY

Aspects of some embodiments include a display device with relatively reduced dead space and relatively improved reliability.

A display device according to some embodiments may include a substrate including a display area, a first peripheral area surrounding an outer edge of the display area, a second peripheral area positioned in a first direction from the display area, and a bending area positioned between the first peripheral area and the second peripheral area, a data distributor in the second peripheral area on the substrate and spaced apart from the display area with the bending area interposed therebetween, a data driver in the second peripheral area on the substrate and positioned in the first direction from the data distributor, first data connection line groups including first data connection lines connected to the data distributor, passing through the bending area, and receiving a data signal output from the data driver in response to a first distribution selection signal, second data connection line groups including second data connection lines connected to the data distributor, passing through the bending area, and receiving the data signal in response to a second distribution selection signal, first power connection lines passing through the bending area, positioned between one of the first data connection line groups and one of the second data connection line groups in a plan view, and receiving a first power supply voltage, and second power connection lines passing through the bending area, positioned between one of the first data connection line groups and one of the second data connection line groups in a plan view, and receiving a second power supply voltage.

According to some embodiments, the bending area may include a first bending area through which the first data connection lines, the second data connection lines, and the first power connection lines pass and a second bending area through which the first data connection lines, the second data connection lines, and the second power connection lines pass.

According to some embodiments, in the first bending area, the number of the first power connection lines positioned between one of the first data connection line groups and one of the second data connection line groups adjacent to each other may be constant.

According to some embodiments, in the second bending area, the number of the second power connection lines positioned between one of the first data connection line groups and one of the second data connection line groups adjacent to each other may be constant.

According to some embodiments, the second bending area may be closer to a center of the bending area than the first bending area.

According to some embodiments, the first bending area included in the bending area may be two or more, the second bending area included in the bending area may be two or more, and the first bending area and the second bending area are alternated with each other.

According to some embodiments, the number of the first data connection lines included in each of the first data connection line groups may be equal to each other, and the number of second data connection lines included in each of the second data connection line groups may be equal to each other.

According to some embodiments, the number of the first data connection lines included in each of the first data connection line groups and the number of second data connection lines included in each of the second data connection line groups may be equal to each other.

According to some embodiments, the first data connection lines, the second data connection lines, the first power connection lines, and the second power connection lines may be spaced apart from each other in a second direction intersecting the first direction.

According to some embodiments, the display device may further include data lines connected to pixels in the display area and extending in the first direction and fan-out lines in the first peripheral area on the substrate and connected to the data lines, and the fan-out lines may have a straight portion extending in the first direction.

According to some embodiments, some of the fan-out lines may connect the data lines and the first data connection lines, and others may connect the data lines and the second data connection lines.

According to some embodiments, the data distributor may include first distribution transistors including a first electrode to which the data signal is applied, a second electrode connected to the first data connection line, and a gate electrode to receive the first distribution selection signal and second distribution transistors including a first electrode to which the data signal is applied, a second electrode connected to the second data connection line, and a gate electrode to receive the second distribution selection signal.

According to some embodiments, the first distribution transistors may output the data signal to the first data connection lines in response to the first distribution selection signal, and the second distribution transistors may output the data signal to the second data connection lines in response to the second distribution selection signal.

According to some embodiments, the display device may further include a first power line in the first peripheral area on the substrate and a second power line in the second peripheral area on the substrate, and the first power connection lines may connect the first power line and the second power line.

According to some embodiments, the display device may further include a third power line in the first peripheral area on the substrate and a fourth power line in the second peripheral area on the substrate, and the second power connection lines may connect the third power line and the fourth power line.

According to some embodiments, the first data connection lines, the second data connection lines, the first power connection lines, and the second power connection lines may be on a same layer.

According to some embodiments, the first data connection lines, the second data connection lines, the first power connection lines, and the second power connection lines may include a same material as each other.

According to some embodiments, the first data connection lines and the second data connection lines may be on a same layer, the first power connection lines and the second power connection lines may be on a same layer, and a layer on which the first data connection lines and the second data connection lines are located may be different from a layer on which the first power connection lines and the second power connection lines are located.

A display device according to some embodiments may include a substrate including a display area, a first peripheral area surrounding an outer edge of the display area, a second peripheral area positioned in a first direction from the display area, and a bending area positioned between the first peripheral area and the second peripheral area, a data driver in the second peripheral area on the substrate and including first output channels and second output channels which alternate with each other, first data connection line groups including first data connection lines connected to the data driver, passing through the bending area, and receiving a data signal output from the first output channels in response to a first distribution selection signal, second data connection line groups including second data connection lines connected to the data driver, passing through the bending area, and receiving a data signal output from the second output channels in response to a second distribution selection signal, first power connection lines passing through the bending area, positioned between one of the first data connection line groups and one of the second data connection line groups in a plan view, and receiving a first power supply voltage, and second power connection lines passing through the bending area, positioned between one of the first data connection line groups and one of the second data connection line groups in a plan view, and receiving a second power supply voltage.

According to some embodiments, the data driver may include first switches receiving the first distribution selection signal and connected to the first output channels and second switches receiving the second distribution selection signal and connected to the second output channels.

According to some embodiments, the first switches may be turned on in response to the first distribution selection signal, the first output channels may output the data signal to the first data connection lines, the second switches may be turned on in response to the second distribution selection signal, and the second output channels may output the data signal to the second data connection lines.

According to some embodiments, the bending area may include a first bending area through which the first data connection lines, the second data connection lines, and the first power connection lines pass and a second bending area through which the first data connection lines, the second data connection lines, and the second power connection lines pass.

According to some embodiments, in the first bending area, the number of the first power connection lines positioned between one of the first data connection line groups and one of the second data connection line groups adjacent to each other may be constant.

According to some embodiments, in the second bending area, the number of the second power connection lines positioned between one of the first data connection line groups and one of the second data connection line groups adjacent to each other may be constant.

According to some embodiments, the display device may further include data lines connected to pixels in the display area and extending in the first direction and fan-out lines in the first peripheral area on the substrate and connected to the data lines, and the fan-out lines have a straight portion extending in the first direction.

According to some embodiments, the first data connection lines, the second data connection lines, the first power connection lines, and the second power connection lines may be on a same layer.

According to some embodiments, the first data connection lines, the second data connection lines, the first power connection lines, and the second power connection lines may include a same material as each other.

According to some embodiments, the first data connection lines, the second data connection lines, the first power connection lines, and the second power connection lines may be spaced apart from each other in a second direction intersecting the first direction.

A display device according to some embodiments may include the first data connection lines and the second data connection lines connected to the data distributor and passing through the bending area. The first data connection lines may receive the data signal in response to the first distribution selection signal, and the second data connection lines may receive the data signal in response to the second distribution selection signal. Accordingly, the data signal may be selectively provided to the two data connection lines. For example, when the first distribution selection signal and the second distribution selection signal have different timings, data time division driving may be implemented.

Meanwhile, the display device may include the first data connection line groups each including first data connection lines adjacent to each other. Also, the display device may include the second data connection line groups each including second data connection lines adjacent to each other. In addition, the display device may include the first power connection lines and the second power connection lines passing through the bending area, and the first power connection lines and the second power connection lines may be positioned between the first data connection line group and the second data connection line group in a plan view. Accordingly, a separate area for arranging the power connection lines in the bending area may not be required. Accordingly, a dead space above and/or below the bending area may be reduced, and a resistance deviation between the fan-out lines above the bending area may be reduced. Accordingly, a reliability of the display device may be improved.

In addition, the first power connection lines and the second power connection lines may prevent or reduce coupling between the first data connection line group and the second data connection line group from occurring. That is, the first power connection lines may function as shielding lines. That is, the first power connection lines and the second power connection lines may be located between the first data connection line groups and the second data connection line groups in a plan view, thereby they may function as a shielding line preventing or reducing the occurrence of coupling between data connection lines. Accordingly, reliability of the display device may be relatively improved.

It is to be understood that both the foregoing general description and the following detailed description are merely illustrations of some features according to the present disclosure and are explanatory and are intended to provide further explanation of the invention as defined in the appended claims, and their equivalents.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
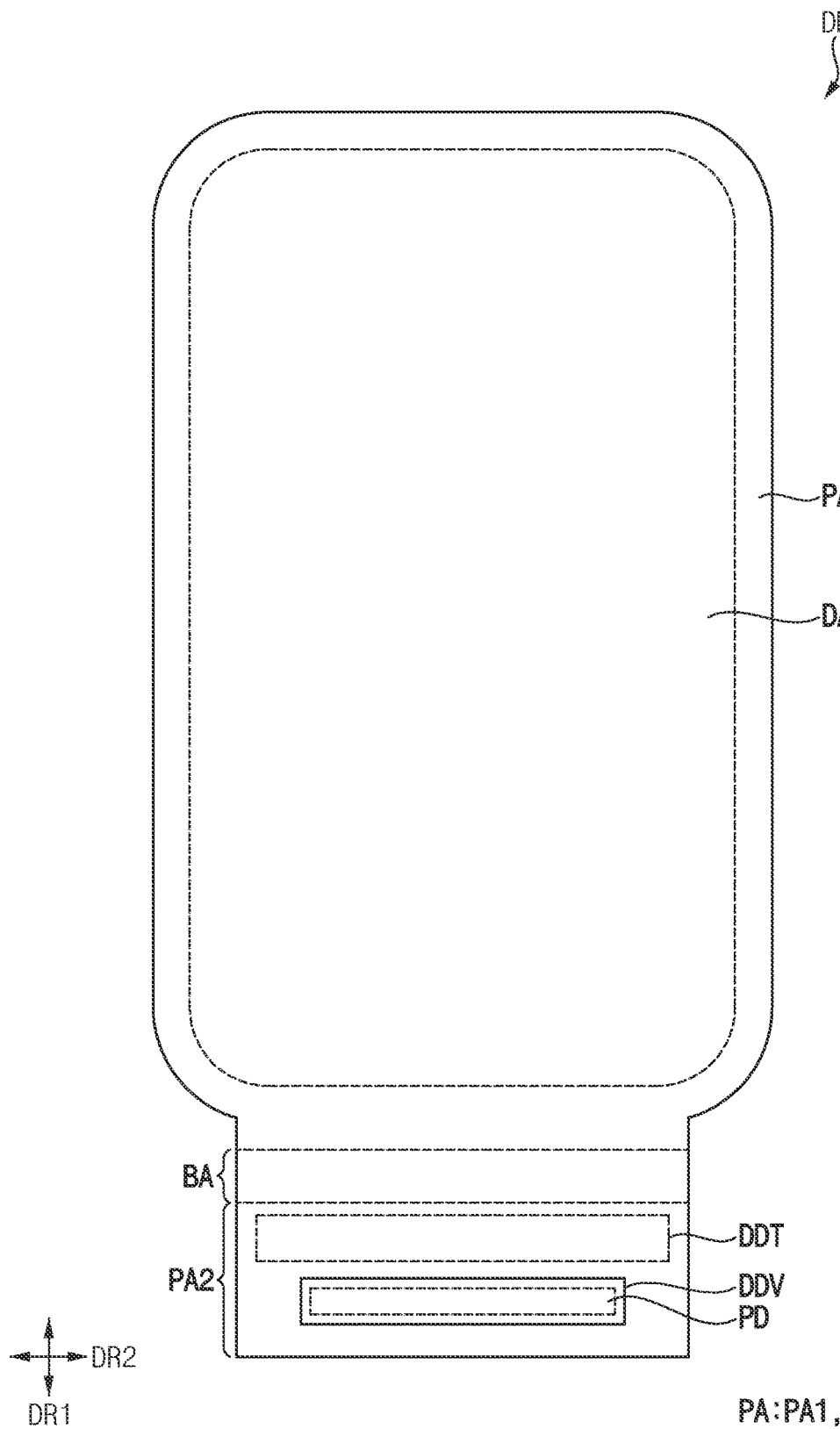
FIG. 1 is a plan view illustrating a display device according to some embodiments.

Aspects of some embodiments of the present invention will now be described more fully hereinafter with reference to the accompanying drawings, in which various embodiments are shown. This invention may however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 is a plan view illustrating a display device according to some embodiments.

Referring to FIG. 1, a display device DD (e.g., a substrate 100 of FIG. 4) may be divided into a display area DA and a peripheral area PA. The display area DA may display images, and the peripheral area PA may be positioned around the display area DA (e.g., in a periphery or outside a footprint of the display area DA). The display area DA may have a rectangular shape on a plane formed by a first direction DR1 and a second direction DR2 intersecting the first direction DR1. A corner of the display area DA may be a rounded curve shape. However, embodiments according to the present invention are not necessarily limited thereto.

The peripheral area PA may include a first peripheral area PA1 surrounding an outer edge of the display area DA, a second peripheral area PA2 positioned in the first direction DR1 from the display area DA, a second peripheral area PA2 positioned in the first direction DR1 from the display area DA, a bending area BA positioned between the first peripheral area PA1 and the second peripheral area PA2. The bending area BA may be a portion or area where the display device DD is folded.

A data distributor DDT and a pad part PD may be located in the second peripheral area PA2. The data distributor DDT may be spaced apart from the display area DA with the bending area BA interposed therebetween. In other words, the data distributor DDT may be positioned in the first direction DR1 from the bending area BA. That is, the data distributor DDT may be positioned below the bending area BA.

The pad part PD may be positioned in the first direction DR1 from the data distributor DDT. The data driver DDV may be connected to the pad part PD. That is, the data driver DDV may be positioned in the first direction DR1 from the data distributor DDT.

Because the data distributor DDT is located in the second peripheral area PA2, when the bending area BA is folded, the data distributor DDT may overlap the first peripheral area PA1 in a plan view. That is, the bending area BA may be bent or folded such that the second peripheral area PA2 (or a portion thereof), including the data distributor DDT and the data driver DDT, may overlap or be located behind the first peripheral area PA1 in a plan view (e.g., a direction perpendicular to a plane defined by the first direction DR1 and the second direction DR2). Accordingly, an area of the first peripheral area PA1 may be reduced compared to a case where the data distributor DDT is located in the first peripheral area PA1. Thus, a dead space of the display device DD may be relatively reduced.

Figure 2:
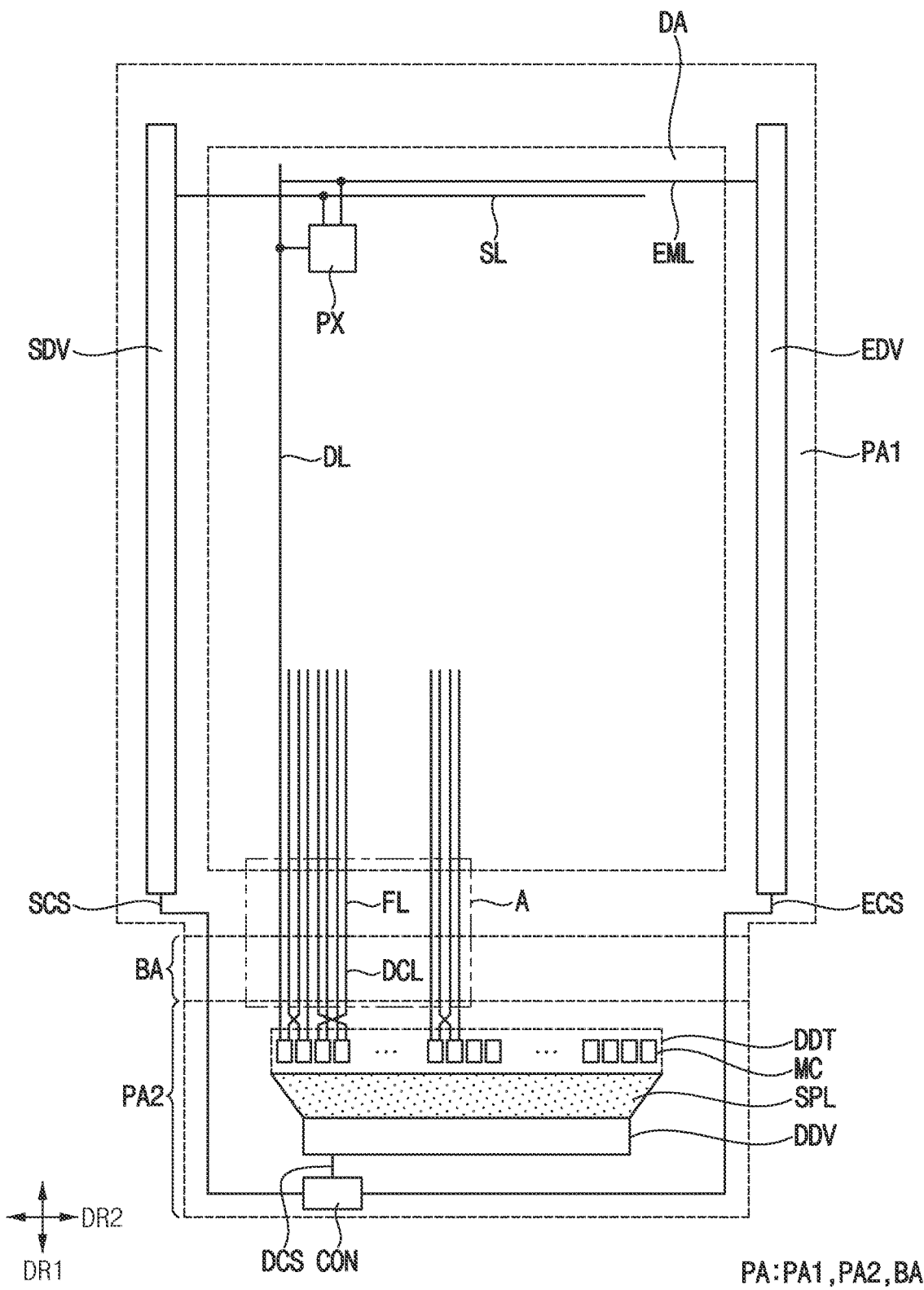
FIG. 2 is a block diagram illustrating a pixel and a driver included in the display device of FIG. 1 according to some embodiments.

FIG. 2 is a block diagram illustrating a pixel and a driver included in the display device of FIG. 1.

Referring to FIGS. 1 and 2, the display device DD may include pixels PX, a driver, and a plurality of lines. Although FIG. 2 illustrates a single pixel PX, as a person having ordinary skill in the art would appreciate, the display device DD may have any suitable number of pixels PX according to the design of the display device DD.

The driver may include a scan driver SDV, an emission driver EDV, a data driver DDV, and a controller CON. Positions of the scan driver SDV, the emission driver EDV, the data driver DDV, and the controller CON shown in FIG. 2 are only an example and may be variously changed.

The lines may provide signals provided from the driver to the pixels PX. The lines may include a scan line SL, a data line DL, an emission control line EML, and a power line. The number of scan lines SL, data lines DL, emission control lines EML, and power lines may vary according to the number of pixels PX and the design of the display device DD.

The pixels PX may be located in the display area DA. The pixels PX may be repeatedly arranged along the first direction DR1 and second direction DR2.

The pixels PX may receive a gate signal from the scan line SL. Also, the pixels PX may receive a data signal through the data line DL. The data signal may be written in the pixels PX in response to the gate signal. Also, the pixels PX may receive an emission control signal through the emission control line EML.

The data driver DDV may generate the data signal based on a data control signal DCS. The data control signal DCS may include an output data enable signal, a horizontal start signal, and a load signal.

The scan driver SDV may generate the gate signal based on a scan control signal SCS. For example, the gate signal may include a gate-on voltage for turning on a transistor and a gate-off voltage for turning off the transistor. The gate control signal may include a vertical start signal and a clock signal.

The emission driver EDV may generate the emission control signal based on an emission control signal ECS. A luminance of the display device DD may be adjusted based on the emission control signal ECS.

The controller CON (e.g., timing controller T-CON) may receive an input image data and a control signal from an external host processor (e.g., GPU). For example, an input image data may be RGB data including red image data, green image data, and blue image data. The control signal may include a vertical synchronization signal, a horizontal synchronization signal, an input data enable signal, a master clock signal, and the like. The controller CON may generate the scan control signal SCS, the data control signal DCS, and the emission control signal ECS based on the input image data and the control signal.

The data driver DDV may be connected to the data distributor DDT through spider lines SPL. Also, as shown in FIG. 2, the data lines DL may be connected to the data distributor DDT through fan-out lines FL and data connection lines DCL. A detailed description of the fan-out lines FL and the data connection lines DCL will be described in more detail later with reference to FIG. 5.

The data distributor DDT may include a plurality of mux circuits MC. The mux circuits MC may be arranged along the second direction DR2. A detailed description of the mux circuits MC will be described in more detail later with reference to FIG. 4.

Figure 3:
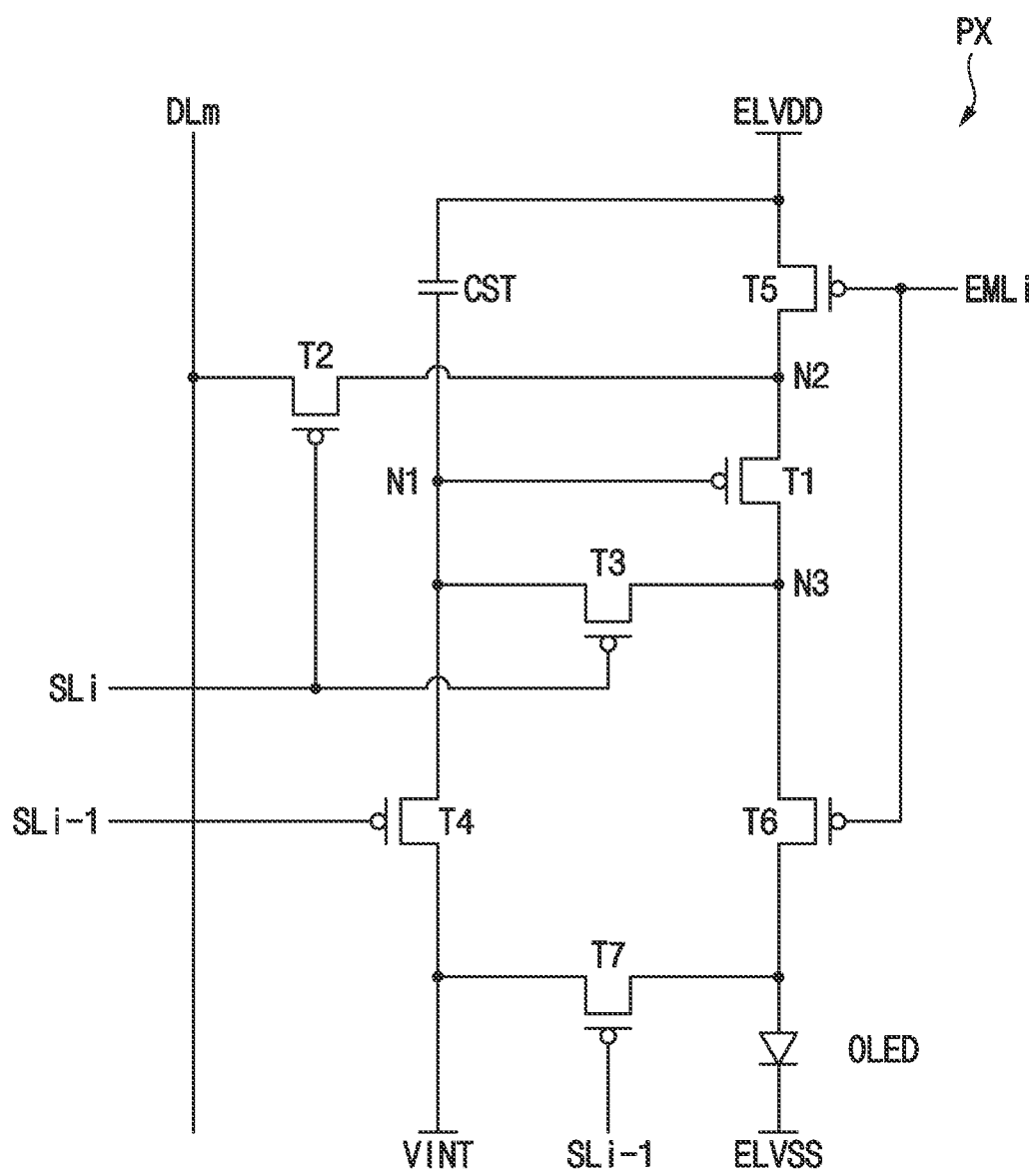
FIG. 3 is a circuit diagram illustrating pixels included in the display device of FIG. 2 according to some embodiments.

FIG. 3 is a circuit diagram illustrating pixels included in the display device of FIG. 2.

Circuit structures of the pixels PX may be the same (or substantially the same). For convenience of explanation, pixels connected to a m-th data line DLm and a i-th scan line SLi will be described.

Referring to FIG. 3, the pixel PX may include first to seventh pixel transistors T1, T2, T3, T4, T5, T6, and T7, a storage capacitor CST, and an organic light emitting diode OLED. Additionally, according to some embodiments, the pixel PX may include additional components or fewer components without departing from the spirit and scope of embodiments according to the present disclosure.

The first pixel transistor T1 may include a gate electrode connected to a first node N1, a first electrode connected to a second node N2, and a second electrode connected to a third node N3.

The second pixel transistor T2 may include a gate electrode connected to the i-th scan line SLi, a first electrode connected to the m-th data line DLm, and a second electrode connected to the second node N2.

The third pixel transistor T3 may include a gate electrode connected to the i-th scan line SLi, a first electrode connected to the first node N1, and a second electrode connected to the third node N3.

The fourth pixel transistor T4 may include a gate electrode connected to a i−1th scan line SLi−1, a first electrode to which an initialization signal VINT is applied, and a second electrode connected to the first node N1.

The fifth pixel transistor T5 may include a gate electrode connected to a i-th emission control line EMLi, a first electrode to which a first power supply voltage ELVDD is applied, and a second electrode connected to the second node N2.

The sixth pixel transistor T6 may include a gate electrode connected to the i-th emission control line EMLi, a first electrode connected to the third node N3, and a second electrode connected to a first electrode (e.g., an anode) of the organic light emitting diode OLED.

The seventh pixel transistor T7 may include a gate electrode connected to the i−1th scan line SLi−1, a first electrode to which the initialization signal VINT is applied, and a second electrode connected to the first electrode of the organic light emitting diode OLED.

The storage capacitor CST may include a first electrode to which the first power supply voltage ELVDD is applied and a second electrode connected to the first node N1.

The organic light emitting diode OLED may include the first electrode and a second electrode (e.g., a cathode) to which a second power supply voltage ELVSS is applied.

In FIG. 3, the first to seventh pixel transistors T1, T2, T3, T4, T5, T6, and T7 are shown as p-channel metal oxide semiconductor (PMOS) transistors, but the present invention is not necessarily limited thereto. For example, the third pixel transistor T3 and the fourth pixel transistor T4 may be n-channel metal oxide semiconductor (NMOS) transistors, and the other pixel transistors may be PMOS transistors. In another example, all of the first to seventh pixel transistors T1, T2, T3, T4, T5, T6, and T7 may be NMOS transistors.

Also, the number of pixel transistors and the number of capacitors shown in FIG. 3 is only an example and may be variously changed according to embodiments.

Figure 4:
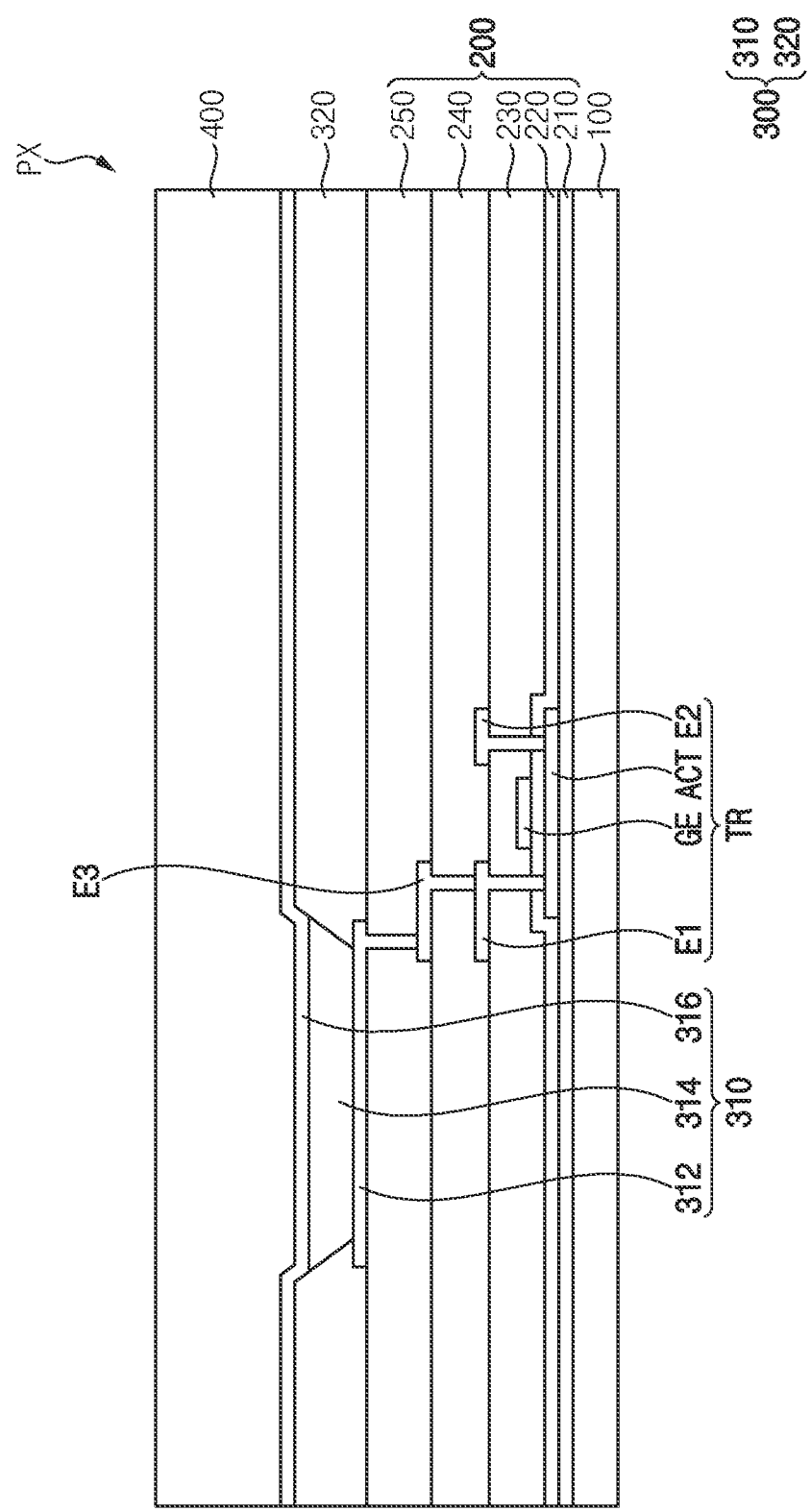
FIG. 4 is a cross-sectional view illustrating a pixel included in the display device of FIG. 2 according to some embodiments.

FIG. 4 is a cross-sectional view illustrating a pixel included in the display device of FIG. 2.

Referring to FIG. 4, the display device DD may include a substrate 100, a circuit device layer 200, a light emitting device layer 300, and an encapsulation layer 400. The circuit device layer 200 may include a transistor TR, a buffer layer 210, a first insulating layer 220, a second insulating layer 230, a third insulating layer 240, and a fourth insulating layer 250. The transistor TR may include an active pattern ACT, a gate electrode GE, a first electrode E1, and a second electrode E2. For example, the transistor TR may correspond to any one of the first to seventh pixel transistors T1, T2, T3, T4, T5, T6, and T7 described in more detail with reference to FIG. 3.

The buffer layer 210 may be located on the substrate 100. The buffer layer 210 may include an inorganic insulating material. The buffer layer 210 may prevent or reduce diffusion of impurities from the substrate 100 to the active pattern ACT.

The active pattern ACT may be located on the buffer layer 210. For example, the active pattern ACT may include a silicon semiconductor or an oxide semiconductor. The silicon semiconductor may include amorphous silicon, polycrystalline silicon, or the like. The active pattern ACT may include a source area, a drain area, and a channel area. The channel area may be located between the source area and the drain area.

The first insulating layer 220 may be located on the buffer layer 210. The first insulating layer 220 may cover the active pattern ACT. The first insulating layer 220 may include an inorganic insulating material.

The gate electrode GE may be located on the first insulating layer 220. The gate electrode GE may overlap the channel area of the active pattern ACT. The gate electrode GE may include a metal, an alloy, a conductive metal oxide, a conductive metal nitride, a transparent conductive material, or the like.

The second insulating layer 230 may be located on the first insulating layer 220. The second insulating layer 230 may cover the gate electrode GE. The second insulating layer 230 may include an inorganic insulating material.

The first electrode E1 and the second electrode E2 may be located on the second insulating layer 230. The first electrode E1 and the second electrode E2 may be connected to the source area and the drain area of the active pattern ACT through contact holes penetrating the first insulating layer 220 and the second insulating layer 230. The first electrode E1 and the second electrode E2 may include a metal, an alloy, a conductive metal oxide, a conductive metal nitride, a transparent conductive material, or the like. The active pattern ACT, the gate electrode GE, the first electrode E1 and the second electrode E2 may be included in the transistor TR.

The third insulating layer 240 may be located on the second insulating layer 230. The third insulating layer 240 may cover the first electrode E1 and the second electrode E2. The third insulating layer 240 may include an organic insulating material. Examples of the organic insulating material that can be used as the third insulating layer 240 may include photoresist, polyacryl-based resin, polyimide-based resin, and polyamide-based resin, siloxane-based resin, acrylic-based resin, epoxy-based resin, or the like. These may be used alone or in combination with each other.

The third electrode E3 may be located on the third insulating layer 240. The third electrode E3 may be connected to the first electrode E1 through a contact hole penetrating the third insulating layer 240. However, the present invention is not necessarily limited thereto. For example, the third electrode E3 may contact the second electrode E2 through a contact hole penetrating the third insulating layer 240. The third electrode E3 may include a metal, an alloy, a conductive metal oxide, a conductive metal nitride, a transparent conductive material, or the like.

The fourth insulating layer 250 may be located on the third insulating layer 240. The fourth insulating layer 250 may cover the third electrode E3. The fourth insulating layer 250 may include an organic insulating material. Examples of the organic insulating material that can be used as the fourth insulating layer 250 may include photoresist, polyacryl-based resin, polyimide-based resin, and polyamide-based resin, siloxane-based resin, acrylic-based resin, epoxy-based resin, or the like. These may be used alone or in combination with each other.

The light emitting device layer 300 may include a light emitting device 310 and a fifth insulating layer 320. The light emitting device 310 may include an anode electrode 312, an emission layer 314, and a cathode electrode 316. For example, the light emitting device 310 may correspond to the organic light emitting diode OLED described with reference to FIG. 3.

The anode electrode 312 may be located on the fourth insulating layer 250. The anode electrode 312 may contact the third electrode E3 through a contact hole penetrating the fourth insulating layer 250. Accordingly, the anode electrode 312 may be electrically connected to the transistor TR. According to some embodiments, the third electrode E3 may be omitted. In this case, the anode electrode 312 may directly contact the first electrode E1 or the second electrode E2. According to some embodiments, the anode electrode 312 may be formed of a metal, alloy, conductive metal oxide, transparent conductive material, or the like.

The fifth insulating layer 320 may be located on the fourth insulating layer 250. The fifth insulating layer 320 may partially cover the anode electrode 312 on the fourth insulating layer 250. The fifth insulating layer 320 may have a pixel opening exposing at least a portion of an upper surface of the anode electrode 312. The fifth insulating layer 320 may include an organic insulating material. Examples of the organic insulating material that can be used as the fifth insulating layer 320 may include photoresist, polyacryl-based resin, polyimide-based resin, polyamide-based resin, siloxane-based resin, acrylic-based resin, epoxy-based resin, or the like. These may be used alone or in combination with each other.

The emission layer 314 may be located on the anode electrode 312. For example, the emission layer 314 may be located on the anode electrode 312 exposed from the fifth insulating layer 320. According to some embodiments, the emission layer 314 may have a multilayer structure including a hole injection layer, a hole transport layer, an organic emission layer, an electron transport layer, and an electron injection layer.

The cathode electrode 316 may be located on the emission layer 314 and the fifth insulating layer 320. The emission layer 314 may emit light based on a voltage difference between the anode electrode 312 and the cathode electrode 316.

The encapsulation layer 400 may be located on the light emitting device layer 300. For example, the encapsulation layer 400 may be located on the cathode electrode 316. The encapsulation layer 400 may include at least one inorganic encapsulation layer and at least one organic encapsulation layer. The encapsulation layer 400 may prevent or reduce penetration of oxygen, moisture, or other contaminants into the light emitting device layer 300 and/or the circuit device layer 200.

Figure 5:
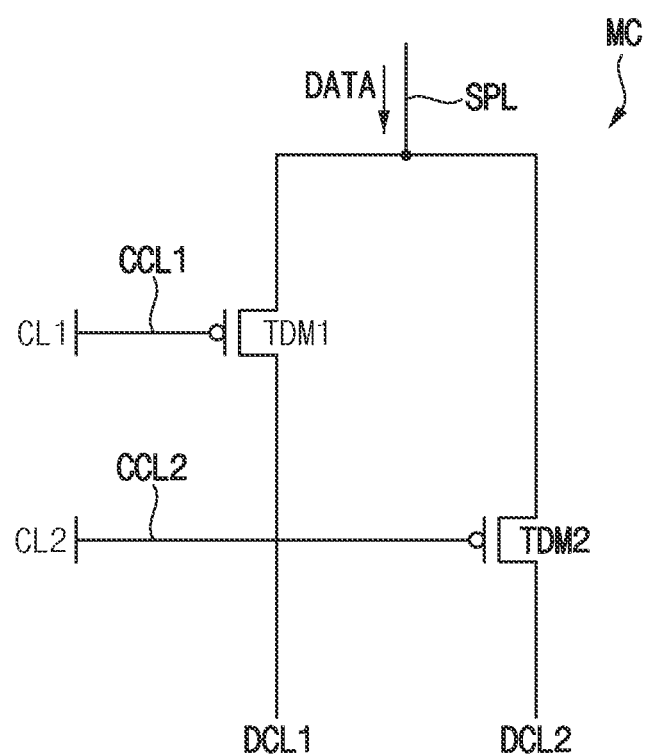
FIG. 5 is a circuit diagram illustrating a mux circuit included in the display device of FIG. 2 according to some embodiments.

FIG. 5 is a circuit diagram illustrating a mux circuit included in the display device of FIG. 2.

In FIG. 5, a case where one spider line SPL is connected to one mux circuit MC and two data connection lines DCL are connected to one mux circuit MC will be described. For example, the data connection lines DCL may include a first data connection line DCL1 and a second data connection line DCL2, and the first data connection line DCL1 and the second data connection line DCL2 may be connected to one mux circuit MC. However, embodiments according to the present invention are not necessarily limited thereto.

Referring to FIG. 5, the mux circuit MC may include a first distribution transistor TDM1 and a second distribution transistor TDM2.

The first distribution transistor TDM1 may include a gate electrode connected to a first distribution selection signal line CCL1, a first electrode to which a data signal DATA is applied, and a second electrode connected to the first data connection line DCL1. A first distribution selection signal CL1 may be applied to the gate electrode through the first distribution selection signal line CCL1. When the first distribution selection signal CL1 is applied to the gate electrode, the first distribution transistor TDM1 may be turned on and the data signal DATA may be output to the first data connection line DCL1. That is, the first distribution transistor TDM1 may output the data signal DATA to the first data connection line DCL1 in response to the first distribution selection signal CL1.

The second distribution transistor TDM2 may include a gate electrode connected to a second distribution selection signal line CCL2, a first electrode to which the data signal DATA is applied, and a second electrode connected to the second data connection line DCL2. A second distribution selection signal CL2 may be applied to the gate electrode through the second distribution selection signal line CCL2. When the second distribution selection signal CL2 is applied to the gate electrode, the second distribution transistor TDM2 may be turned on and the data signal DATA may be output to the second data connection line DCL2. That is, the second distribution transistor TDM2 may output the data signal DATA to the second data connection line DCL2 in response to the second distribution selection signal CL2.

The first distribution transistor TDM1 and the second distribution transistor TDM2 may be selectively turned on by the first distribution selection signal CL1 and the second distribution selection signal CL2. Accordingly, the data signal DATA may be selectively provided to the two data connection lines.

Figure 6:
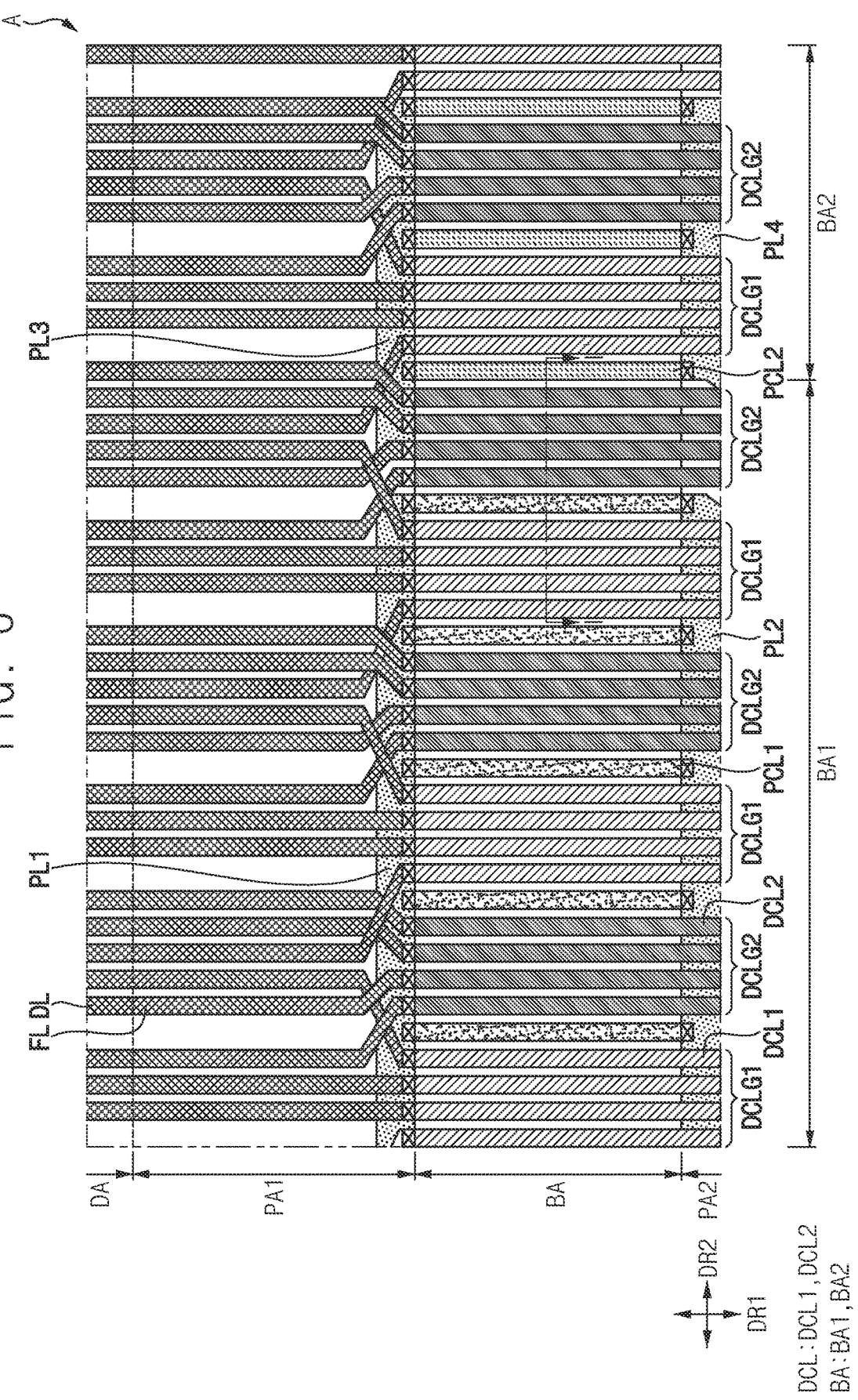
FIG. 6 is an enlarged view illustrating an area of A in FIG. 2 according to some embodiments according to some embodiments.

FIG. 6 is an enlarged view illustrating an area of A in FIG. 2 according to some embodiments.

Referring to FIGS. 2, 5 and 6, the display device DD may include a data line part and a power line part.

According to some embodiments, the data line part may include data lines DL, fan-out lines FL, and data connection lines DCL. The data connection lines DCL may be connected to the data distributor DDT and pass through the bending area BA. The data connection lines DCL may be connected to the data lines DL through the fan-out lines FL. The data connection lines DCL may receive the data signal DATA output from the data driver DDV.

According to some embodiments, the fan-out lines FL may have a straight portion extending in the first direction DR1. For example, the fan-out lines FL may extend parallel to each other in the first direction DR1 in one section of the first peripheral area PA1. Accordingly, a resistance deviation between the fan-out lines FL located above the bending area BA may be reduced.

The data connection lines DCL may include the first data connection lines DCL1 and the second data connection lines DCL2. According to some embodiments, some of the fan-out lines FL connect the data lines DL and the first data connection lines DCL1, and others connect the data lines DL and the second data connection lines DCL2.

The first data connection lines DCL1 may receive the data signal DATA output from the data driver DDV in response to the first distribution selection signal CL1 applied to the mux circuit MC. According to some embodiments, four of the first data connection lines DCL1 may be adjacent to each other in the bending area BA. Four of the first data connection lines DCL1 may form a first data connection line group DCLG1. That is, one of the first data connection line group DCLG1 may include four of the first data connection lines DCL1. However, embodiments according to the present invention are not necessarily limited thereto, and the number of the first data connection lines DCL1 included in the first data connection line group DCLG1 may be variously changed according to embodiments.

Accordingly, a plurality of the first data connection line groups DCLG1 may be formed, and the first data connection line groups DCLG1 may be arranged along the second direction DR2. According to some embodiments, the number of the first data connection lines DCL1 included in each of the first data connection line groups DCLG1 may be the equal to each other.

The second data connection lines DCL2 may receive the data signal DATA output from the data driver DDV in response to the second distribution selection signal CL2 applied to the mux circuit MC. According to some embodiments, four of the second data connection lines DCL2 may be adjacent to each other in the bending area BA. Four of the second data connection lines DCL2 may form a second data connection line group DCLG2. That is, one of the second data connection line group DCLG2 may include four of the second data connection lines DCL2. However, embodiments according to the present invention are not necessarily limited thereto, and the number of the second data connection lines DCL2 included in the second data connection line group DCLG2 may be variously changed according to embodiments.

Accordingly, a plurality of the second data connection line groups DCLG2 may be formed, and the second data connection line groups DCLG2 may be arranged along the second direction DR2. According to some embodiments, the number of the second data connection lines DCL2 included in each of the second data connection line groups DCLG2 may be the equal to each other.

According to some embodiments, the number of the first data connection lines DCL1 included in each of the first data connection line groups DCLG1 and the number of the second data connection lines included in each of the second data connection line groups DCLG2 may be equal to each other.

According to some embodiments, the first data connection line groups DCLG1 and the second data connection line groups DCLG2 may be alternately positioned along the second direction DR2. That is, one of the second data connection groups DCLG2 may be positioned between the mutually adjacent first data connection groups DCLG1, and one of the first data connection groups DCLG1 may be positioned between the mutually adjacent second data connection groups DCLG2.

The power line part may include a first power line PL1, a second power line PL2, a third power line PL3, a fourth power line PL4, first power connection lines PCL1, and second power connection lines PCL2. The first power line PL1 and the third power line PL3 may be located in the first peripheral area PA1. The second power line PL2 and the fourth power line PL4 may be located in the second peripheral area PA2.

The first power connection lines PCL1 may be connected to the first power line PL1 and the second power line PL2. That is, the first connection power lines PCL1 may connect the first power line PL1 and the second power line PL2. The first power voltage ELVDD may be supplied to the first power line PL1, the second power line PL2, and the first power connection lines PCL1.

The first power connection lines PCL1 may pass through the bending area BA. According to some embodiments, the bending area BA may include a first bending area BA1 and a second bending area BA2. For example, the second bending area BA2 may be an area closer to a center of the bending area BA than the first bending area BA1. That is, the second bending area BA2 may be relatively positioned inside of the bending area BA, and the first bending area BA1 may be relatively positioned outside of the bending area BA. According to some embodiments, the first power connection lines PCL1 may pass through the first bending area BA1. That is, the first bending area BA1 may be an area through which the first data connection lines DCL1, the second data connection lines DCL2, and the first power connection lines PCL1 pass.

According to some embodiments, the first power connection lines PCL1 may be positioned between the first data connection line group DCLG1 and the second data connection line group DCLG2 in a plan view. Accordingly, in the first bending area BA1, the first power connection lines PCL1 prevent or reduce coupling between the first data connection line group DCLG1 and the second data connection line group DCLG2 from occurring. That is, the first power connection lines PCL1 may function as shielding lines.

According to some embodiments, in the first bending area BA1, the number of the first power connection lines PCL1 positioned between the first data connection line group DCLG1 and the second data connection line group DCLG2 adjacent to each other may be constant. For example, one of the first power connection line PCL1 may be positioned between the first data connection line group DCLG1 and second data connection line group DCLG2 adjacent to each other. However, the present invention is not necessarily limited thereto.

The second power connection lines PCL2 may be connected to the third power line PL3 and the fourth power line PL4. That is, the second connection power lines PCL2 may connect the third power line PL3 and the fourth power line PL4. The second power voltage ELVSS may be supplied to the third power line PL3, the fourth power line PL4, and the second power connection lines PCL2.

The second power connection lines PCL2 may pass through the bending area BA. According to some embodiments, the second power connection lines PCL2 may pass through the second bending area BA2. That is, the second bending area BA2 may be an area through which the first data connection lines DCL1, the second data connection lines DCL2, and the second power connection lines PCL2 pass.

According to some embodiments, the second power connection lines PCL2 may be positioned between the first data connection line group DCLG1 and the second data connection line group DCLG2 in a plan view. Accordingly, in the second bending area BA2, the second power connection lines PCL2 prevent or reduce coupling between the first data connection line group DCLG1 and the second data connection line group DCLG2 from occurring. That is, the second power connection lines PCL2 may function as shielding lines.

According to some embodiments, in the second bending area BA2, the number of the second power connection lines PCL2 positioned between the first data connection line group DCLG1 and the second data connection line group DCLG2 adjacent to each other may be constant. For example, one of the second power connection line PCL2 may be positioned between the first data connection line group DCLG1 and second data connection line group DCLG2 adjacent to each other. However, embodiments according to the present invention are not necessarily limited thereto.

According to some embodiments, the first data connection lines DCL1, the second data connection lines DCL2, the first power connection lines PCL1, and the second power connection lines PCL2 may be spaced apart from each other in the second direction DR2.

Meanwhile, in FIG. 6, each of the first data connection lines DCL1, the second data connection lines DCL2, the first power connection lines PCL1, and the second power connection lines PCL2 may have a same width in the second direction DR2, but embodiments according to the present invention are not necessarily limited thereto.

Meanwhile, a plurality of driving power lines may be connected to the first power line PL1. The driving power lines may extend into the display area DA and may apply driving power to the pixels PX. Also, a plurality of common power lines may be connected to the third power line PL3. The common power lines may apply common power to the cathode electrode.

Figure 7:
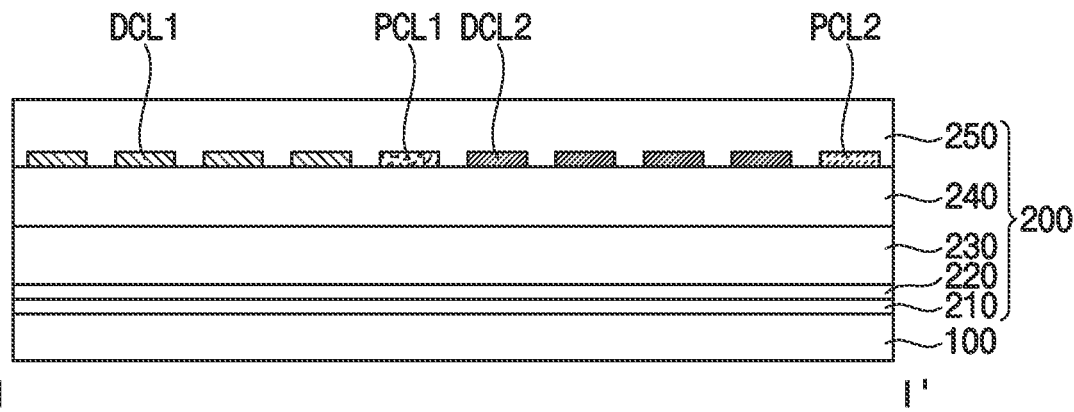
FIG. 7 is a cross-sectional view taken along the line I-I' of FIG. 6 according to some embodiments.

FIG. 7 is a cross-sectional view taken along the line I-I' of FIG. 6 according to some embodiments.

Referring to FIGS. 6 and 7, the first data connection lines DCL1, the second data connection lines DCL2, the first power connection lines PCL1, and the second power connection lines PCL2 may be located on a same layer. For example, the first data connection lines DCL1, the second data connection lines DCL2, the first power connection lines PCL1, and the second power connection lines PCL2 may be located on a same layer as the third electrode E3. That is, the first data connection lines DCL1, the second data connection lines DCL2, the first power connection lines PCL1, and the second power connection lines PCL2 may be located on the third insulating layer 240.

An example of a material that can be used as each of the first data connection lines DCL1, the second data connection lines DCL2, the first power connection lines PCL1, and the second power connection lines PCL2 may include silver (Ag), alloy containing silver, molybdenum (Mo), alloy containing molybdenum, aluminum (Al), alloy containing aluminum, aluminum nitride (AlN), tungsten (W), tungsten nitride (WN), Copper (Cu), Nickel (Ni), Chromium (Cr), Chromium Nitride (CrN), Titanium (Ti), Tantalum (Ta), Platinum (Pt), Scandium (Sc), Indium Tin Oxide (ITO), indium zinc oxide (IZO), or the like. These may be used alone or in combination with each other.

According to some embodiments, the first data connection lines DCL1, the second data connection lines DCL2, the first power connection lines PCL1, and the second power connection lines PCL2 may include a same material.

Figure 8:
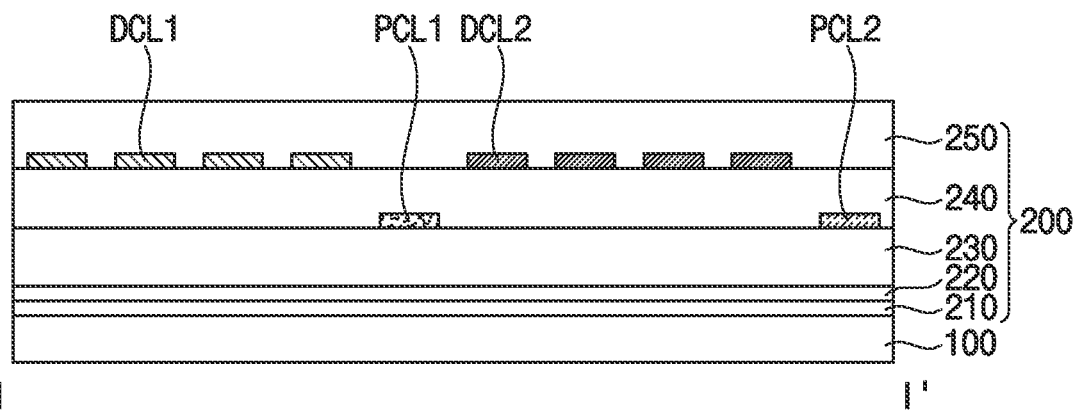
FIG. 8 is a cross-sectional view taken along the line I-I' of FIG. 6 according to some embodiments.
Figure 9:
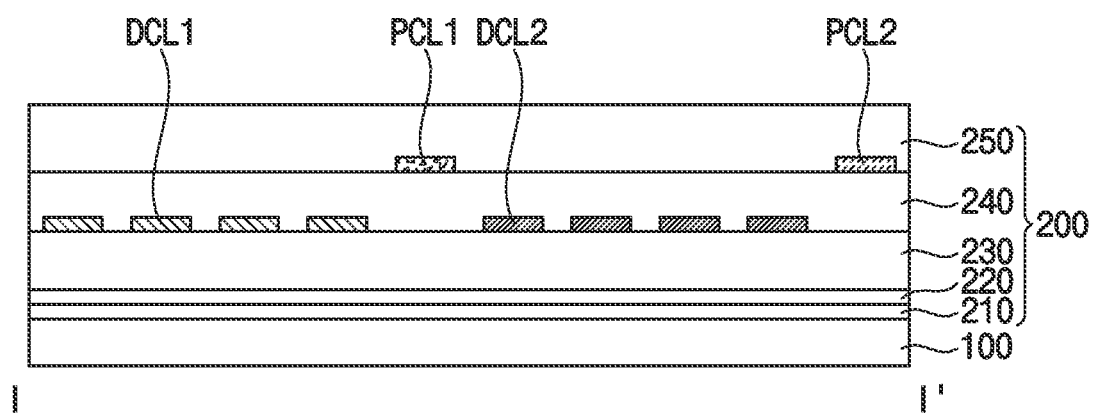
FIG. 9 is a cross-sectional view taken along the line I-I' of FIG. 6 according to some embodiments.

FIG. 8 is a cross-sectional view taken along the line I-I' of FIG. 6 according to some embodiments, and FIG. 9 is a cross-sectional view taken along the line I-I' of FIG. 6 according to some embodiments.

Referring to FIGS. 6, 8 and 9, the first data connection lines DCL1, the second data connection lines DCL2, the first power connection lines PCL1, and the second power connection lines PCL2 may be located on different layers. For example, as shown in FIG. 8, the first data connection lines DCL1 and the second data connection lines DCL2 may be located on the third insulating layer 240 and the first power connection lines PCL1 and the second power connection lines PCL2 may be located on the second insulating layer 230. For another example, as shown in FIG. 9, the first data connection lines DCL1 and the second data connection lines DCL2 may be located on the second insulating layer 230, and the first power connection lines PCL1 and the second power connection lines PCL2 may be located on the third insulating layer 240. However, embodiments according to the present invention are not necessarily limited thereto.

According to embodiments, the display device DD may include the first data connection lines DCL1 and the second data connection lines DCL2 connected to the data distributor DDT and passing through the bending area BA. The first data connection lines DCL1 may receive the data signal DATA in response to the first distribution selection signal CL1, and the second data connection lines DCL2 may receive the data signal DATA in response to the second distribution selection signal CL2. Accordingly, the data signal DATA may be selectively provided to the two data connection lines. For example, when the first distribution selection signal CL1 and the second distribution selection signal CL2 have different timings, data time division driving may be implemented.

Meanwhile, the display device DD may include the first data connection line groups DCLG1 each including first data connection lines DCL1 adjacent to each other. Also, the display device DD may include the second data connection line groups DCLG2 each including second data connection lines DCL2 adjacent to each other. In addition, the display device DD may include the first power connection lines PCL1 and the second power connection lines PCL2 passing through the bending area BA, and the first power connection lines PCL1 and the second power connection lines PCL2 may be positioned between the first data connection line group DCLG1 and the second data connection line group DCLG2 in a plan view. Accordingly, a separate area for arranging the power connection lines in the bending area BA may not be required. Accordingly, a dead space above and/or below the bending area BA may be reduced, and a resistance deviation between the fan-out lines FL located above the bending area BA may be reduced. Accordingly, a reliability of the display device DD may be improved.

In addition, the first power connection lines PCL1 and the second power connection lines PCL2 may prevent or reduce coupling between the first data connection line group DCLG1 and the second data connection line group DCLG2 from occurring. That is, the first power connection lines PCL1 may function as shielding lines. That is, the first power connection lines PCL1 and the second power connection lines PCL2 may be located between the first data connection line groups DCLG1 and the second data connection line groups DCLG2 in a plan view, thereby they may function as a shielding line preventing or reducing the occurrence of coupling between data connection lines. Accordingly, reliability of the display device DD may be relatively improved.

Figure 10:
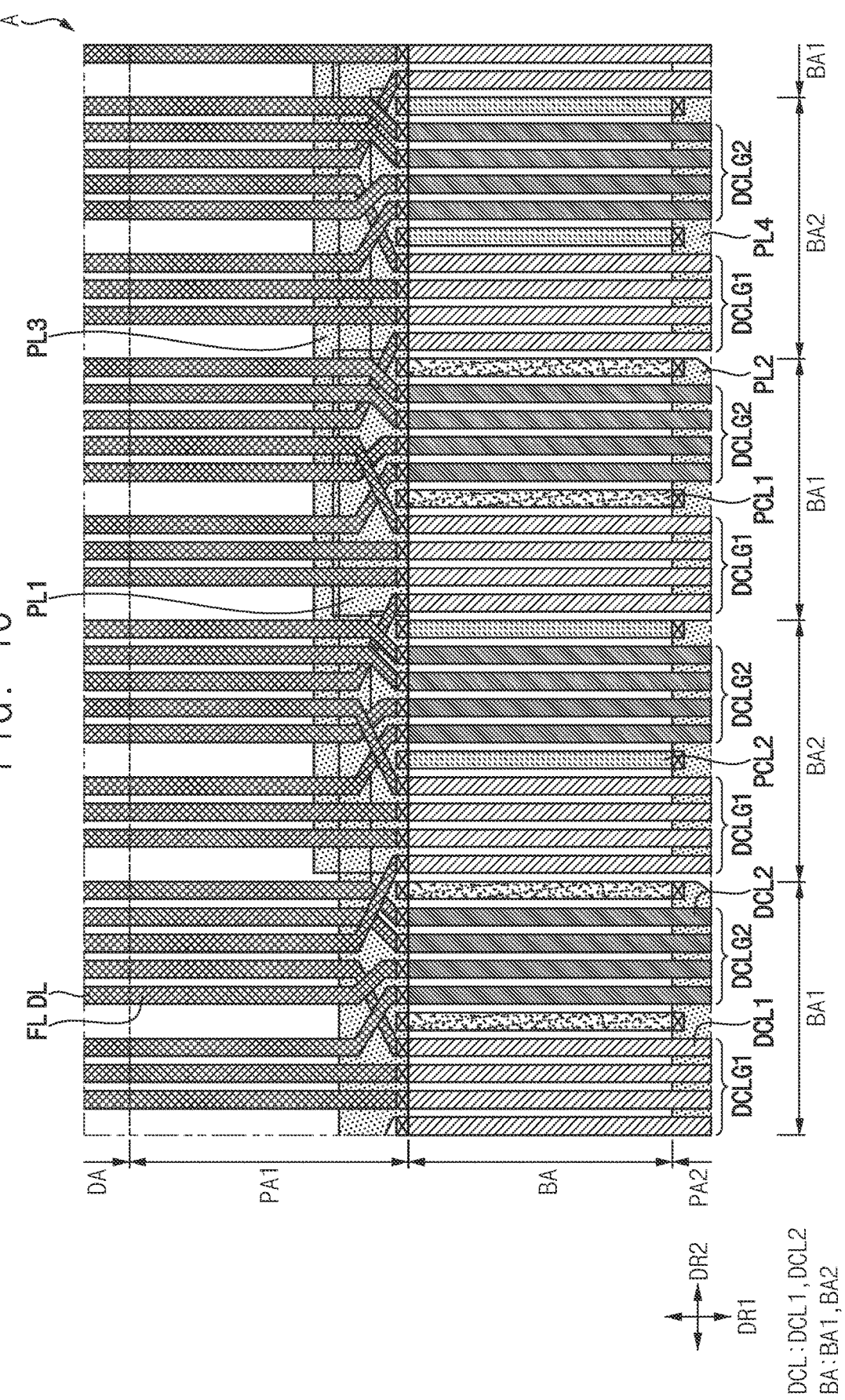
FIG. 10 is an enlarged view illustrating an area of A in FIG. 2 according to some embodiments.

FIG. 10 is an enlarged view illustrating an area of A in FIG. 2 according to some embodiments. For example, FIG. 10 may correspond to an enlarged view of FIG. 6.

Referring to FIG. 10, according to some embodiments, the bending area BA may include two or more of each of the first bending area BA1 and the second bending area BA2, and the first bending areas BA1 and the second bending areas BA2 may alternate with each other. That is, the first bending areas BA1 and the second bending areas BA2 may alternate with each other in the second direction DR2.

Similar to the description with reference to FIG. 6, according to some embodiments, the first power connection lines PCL1 may pass through the first bending area BA1. That is, the first bending area BA1 may be an area through which the first data connection lines DCL1, the second data connection lines DCL2, and the first power connection lines PCL1 pass. The second power connection lines PCL2 may pass through the second bending area BA2. That is, the second bending area BA2 may be an area through which the first data connection lines DCL1, the second data connection lines DCL2, and the second power connection lines PCL2 pass.

According to some embodiments, as the first bending areas BA1 and the second bending areas BA2 alternate with each other, power supplied to the first power connection lines PCL1 and the second power connection lines PCL2 may be distributed. Accordingly, heat generation characteristics of the display device DD may be improved. Accordingly, reliability of the display device DD may be further improved.

Figure 11:
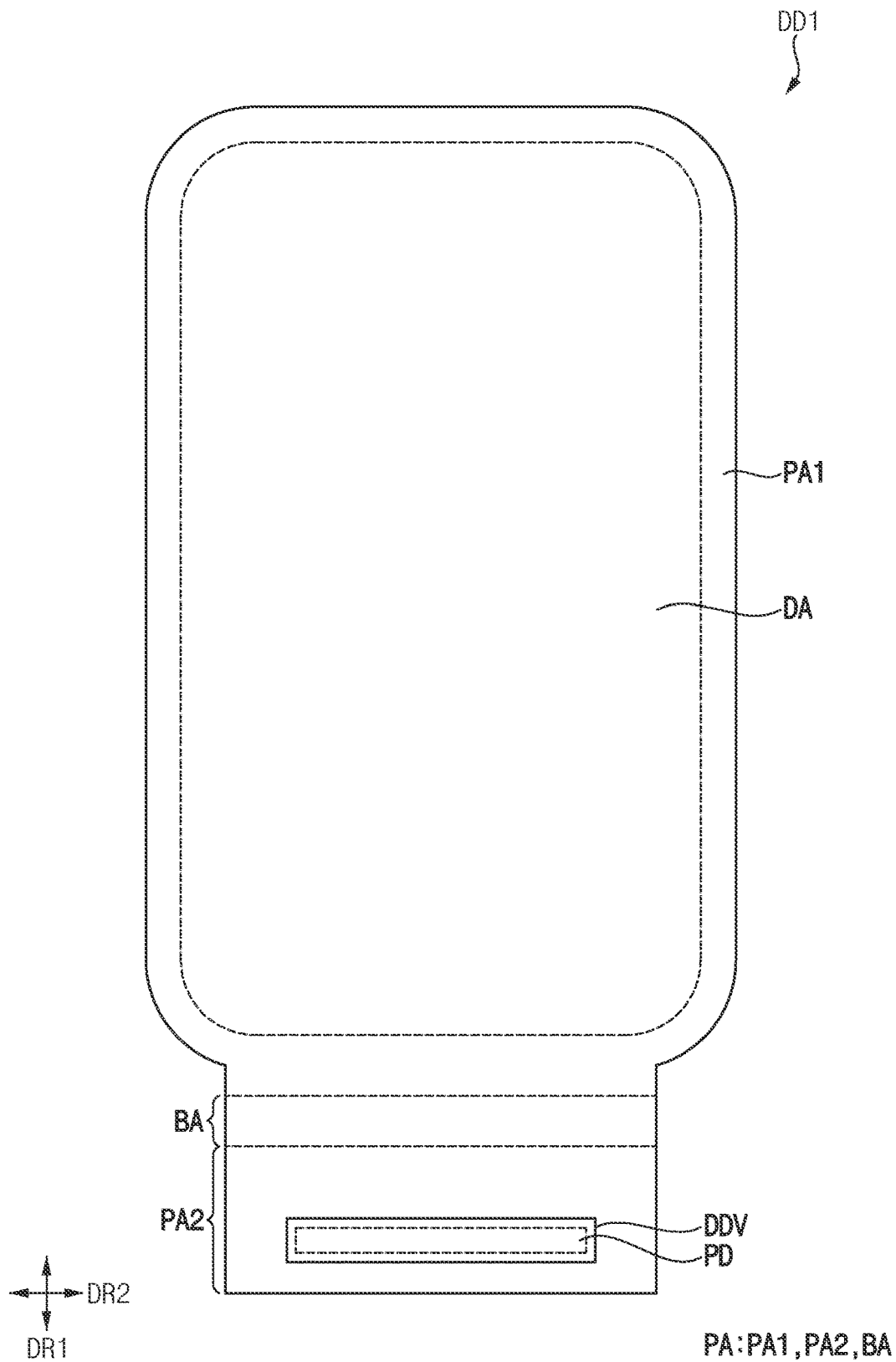
FIG. 11 is a plan view illustrating a display device according to some embodiments.
Figure 12:
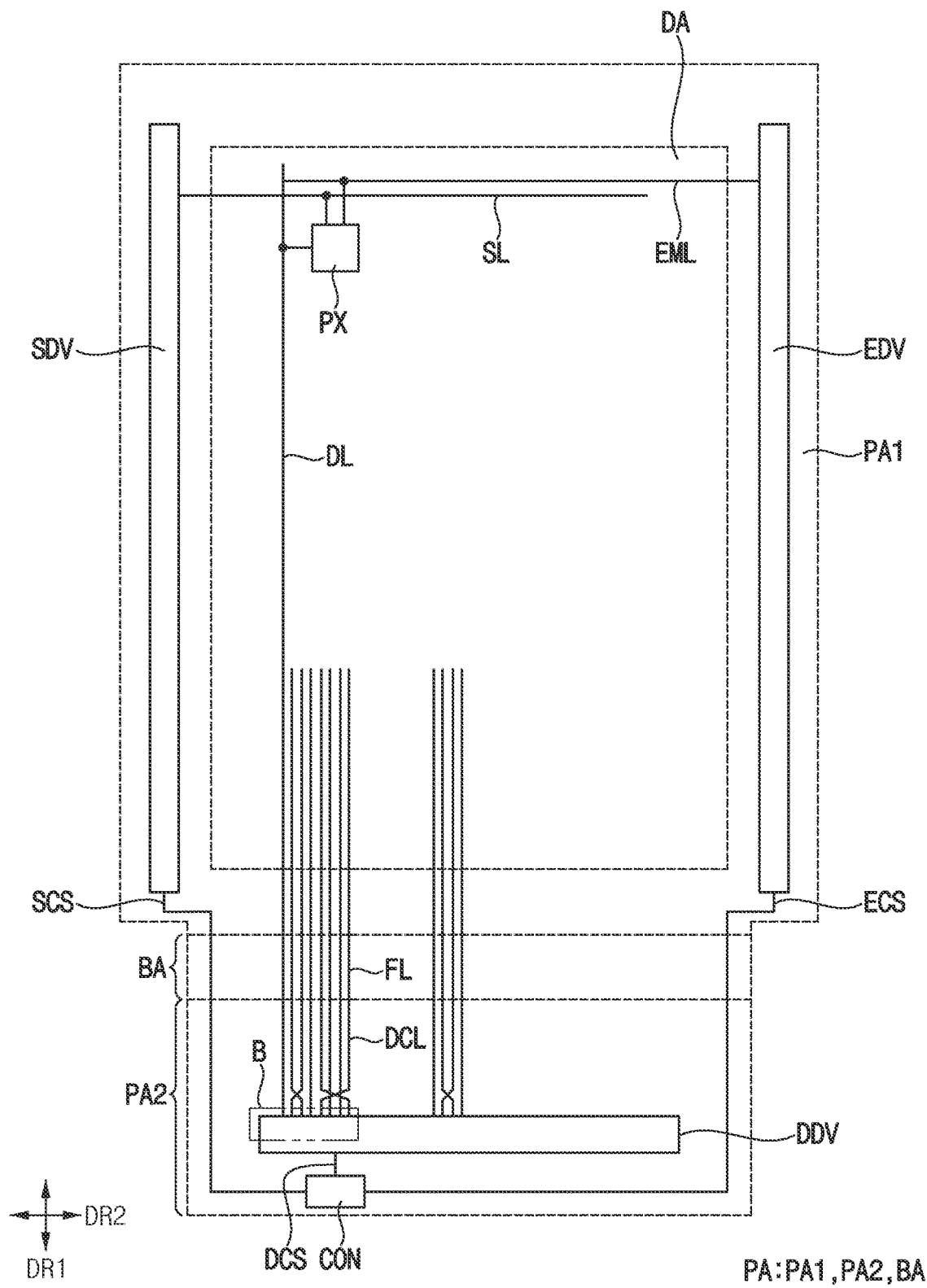
FIG. 12 is a block diagram illustrating a pixel and a driver included in the display device of FIG. 11 according to some embodiments.
Figure 13:
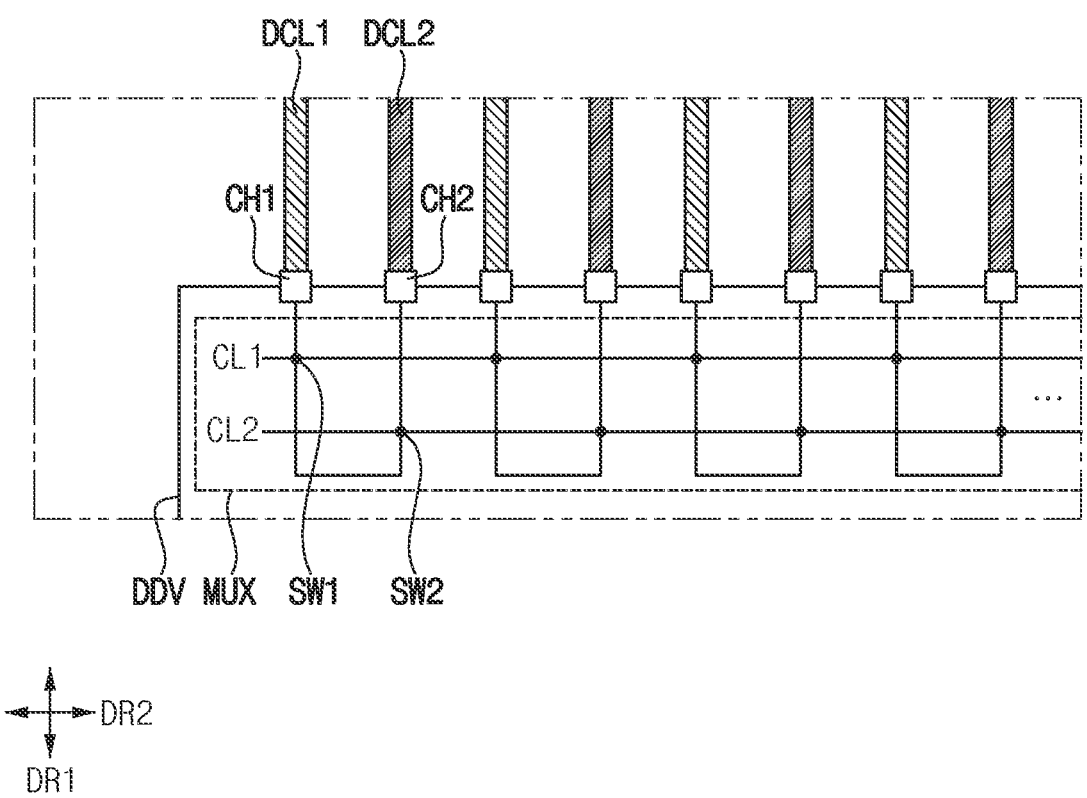
FIG. 13 is an enlarged view illustrating an area of B of FIG. 12 according to some embodiments.

FIG. 11 is a plan view illustrating a display device according to some embodiments, FIG. 12 is a block diagram illustrating a pixel and a driver included in the display device of FIG. 11, and FIG. 13 is an enlarged view illustrating an area of B of FIG. 12.

Hereinafter, a display device DD1 according to some embodiments will be described with reference to FIGS. 11 to 13. However, in the display device DD1, the display device DD1 may be substantially same as the display device DD described with reference to FIGS. 1 to 10 except that the data distributor DDT is omitted and a demux MUX and output channels are included in the data driver DDV. Therefore, redundant descriptions are omitted or simplified.

Referring to FIGS. 11 to 13, the data connection lines DCL may be connected to the data driver DDV and the data driver DDV may include the demux MUX, first output channels CH1, and second output channels CH1.

The first output channels CH1 and the second output channels CH2 may alternate with each other. For example, the first output channels CH1 may correspond to odd-numbered output channels, and the second output channels CH2 may correspond to even-numbered output channels. However, embodiments according to the present invention are not necessarily limited thereto.

Each of the first output channels CH1 and the second output channels CH2 may output a data signal to the data connection lines DCL. For example, the first output channels CH1 may output the data signal to the first data connection lines DCL1, and the second output channels CH2 may output the data signal to the second data connection lines DCL2.

According to some embodiments, the demux MUX may output the data signal to each output group grouped by two output lines. The demux MUX may include first switches SW1 and second switches SW2.

The first switches SW1 may be connected to the first output channels CH1. The first switches SW1 may receive the first distribution selection signal CL1. For example, the first switches SW1 may be turned on in response to the first distribution selection signal CL1, and each of the first output channels CH1 may output the data signal to the first data connection lines DCL1.

The second switches SW2 may be connected to the second output channels CH2. The second switches SW2 may receive the second distribution selection signal CL2. For example, the second switches SW2 may be turned on in response to the second distribution selection signal CL2, and each of the second output channels CH2 may output the data signal to the second data connection lines DCL2.

Accordingly, the data signal may be selectively provided to the two data connection lines. For example, when the first distribution selection signal CL1 and the second distribution selection signal CL2 have different timings, data time division driving may be implemented.

Meanwhile, the display device DD1 may include the data driver DDV including the demux MUX. That is, the demux MUX for distributing data signals may be embedded in the data driver DDV. Accordingly, a separate data distributor may not be located. Accordingly, a area of the peripheral area PA may be reduced compared to a case where the data distributor is located in the peripheral area PA. Thus, a dead space of the display device DD1 may be relatively reduced.

Meanwhile, although FIG. 13 shows that the demux MUX outputs data voltages for each output group grouped by two output lines, embodiments according to the present invention are not necessarily limited thereto. For example, the demux MUX may output data voltages for each output group of three or more output lines. That is, the demux MUX may include three or more switches that receive distribution selection signals of different timings.

The invention should not be construed as being limited to the embodiments set forth herein. Rather, these embodiments are provided so that this disclosure will be thorough and complete and will more fully convey the concepts of embodiments according to the present invention to those skilled in the art.

While aspects of some embodiments of the present invention have been particularly shown and described with reference to some embodiments thereof, it will be understood by those of ordinary skill in the art that various changes in form and details may be made therein without departing from the spirit or scope of embodiments according to the present disclosure as defined by the following claims, and their equivalents.

What is claimed is:

1. A display device comprising:
    a substrate including a display area, a first peripheral area surrounding an outer edge of the display area, a second peripheral area positioned in a first direction from the display area, and a bending area between the first peripheral area and the second peripheral area;
    a data distributor in the second peripheral area on the substrate and spaced apart from the display area with the bending area interposed therebetween;
    a data driver in the second peripheral area on the substrate and positioned in the first direction from the data distributor;
    first data connection line groups including first data connection lines connected to the data distributor, passing through the bending area, and configured to receive a data signal output from the data driver in response to a first distribution selection signal;
    second data connection line groups including second data connection lines connected to the data distributor, passing through the bending area, and configured to receive the data signal in response to a second distribution selection signal;
    first power connection lines passing through the bending area, positioned between one of the first data connection line groups and one of the second data connection line groups in a plan view, and configured to receive a first power supply voltage; and
    second power connection lines passing through the bending area, positioned between one of the first data connection line groups and one of the second data connection line groups in a plan view, and configured to receive a second power supply voltage, different from the first power supply voltage.

2. The display device of claim 1, wherein the bending area includes:
    a first bending area through which the first data connection lines, the second data connection lines, and the first power connection lines pass; and
    a second bending area through which the first data connection lines, the second data connection lines, and the second power connection lines pass.

3. The display device of claim 2, wherein in the first bending area, a number of the first power connection lines positioned between one of the first data connection line groups and one of the second data connection line groups adjacent to each other is constant.

4. The display device of claim 2, wherein in the second bending area, a number of the second power connection lines positioned between one of the first data connection line groups and one of the second data connection line groups adjacent to each other is constant.

5. The display device of claim 2, wherein the second bending area is closer to a center of the bending area than the first bending area.

6. The display device of claim 2, wherein the first bending area included in the bending area is two or more, the second bending area included in the bending area is two or more, and the first bending area and the second bending area are alternated with each other.

7. The display device of claim 1, wherein a number of the first data connection lines included in each of the first data connection line groups is equal to each other, and
    a number of second data connection lines included in each of the second data connection line groups is equal to each other.

8. The display device of claim 7, wherein a number of the first data connection lines included in each of the first data connection line groups and a number of second data connection lines included in each of the second data connection line groups are equal to each other.

9. The display device of claim 1, wherein the first data connection lines, the second data connection lines, the first power connection lines, and the second power connection lines are spaced apart from each other in a second direction intersecting the first direction.

10. The display device of claim 1, further comprising:
    data lines connected to pixels in the display area and extending in the first direction; and
    fan-out lines in the first peripheral area on the substrate and connected to the data lines,
    wherein the fan-out lines have a straight portion extending in the first direction.

11. The display device of claim 10, wherein a first group of the fan-out lines connect the data lines and the first data connection lines, and a second group of the fan-out lines connect the data lines and the second data connection lines.

12. The display device of claim 1, wherein the data distributor includes:
    first distribution transistors including a first electrode to which the data signal is applied, a second electrode connected to the first data connection lines, and a gate electrode configured to receive the first distribution selection signal; and
    second distribution transistors including a first electrode to which the data signal is applied, a second electrode connected to the second data connection lines, and a gate electrode configured to receive the second distribution selection signal.

13. The display device of claim 12, wherein the first distribution transistors are configured to output the data signal to the first data connection lines in response to the first distribution selection signal, and
the second distribution transistors are configured to output the data signal to the second data connection lines in response to the second distribution selection signal.

14. The display device of claim 1, further comprising:
a first power line in the first peripheral area on the substrate and a second power line in the second peripheral area on the substrate, and
wherein the first power connection lines connect the first power line and the second power line.

15. The display device of claim 14, further comprising:
a third power supply line in the first peripheral area on the substrate and a fourth power supply line in the second peripheral area on the substrate, and
wherein the second power connection lines connect the third power supply line and the fourth power supply line.

16. The display device of claim 1, wherein the first data connection lines, the second data connection lines, the first power connection lines, and the second power connection lines are on a same layer.

17. The display device of claim 1, wherein the first data connection lines, the second data connection lines, the first power connection lines, and the second power connection lines include a same material as each other.

18. The display device of claim 1, wherein the first data connection lines and the second data connection lines are on a same layer,
the first power connection lines and the second power connection lines are on a same layer, and
a layer on which the first data connection lines and the second data connection lines are located is different from a layer on which the first power connection lines and the second power connection lines are located.

19. A display device comprising:
a substrate including a display area, a first peripheral area surrounding an outer edge of the display area, a second peripheral area positioned in a first direction from the display area, and a bending area positioned between the first peripheral area and the second peripheral area;
a data driver in the second peripheral area on the substrate and including first output channels and second output channels which alternate with each other;
first data connection line groups including first data connection lines connected to the data driver, passing through the bending area, and configured to receive a data signal output from the first output channels in response to a first distribution selection signal;
second data connection line groups including second data connection lines connected to the data driver, passing through the bending area, and configured to receive a data signal output from the second output channels in response to a second distribution selection signal;
first power connection lines passing through the bending area, positioned between one of the first data connection line groups and one of the second data connection line groups in a plan view, and configured to receive a first power supply voltage; and
second power connection lines passing through the bending area, positioned between one of the first data connection line groups and one of the second data connection line groups in a plan view, and configured to receive a second power supply voltage, different from the first power supply voltage.

20. The display device of claim 19, wherein the data driver includes:
first switches configured to receive the first distribution selection signal and connected to the first output channels; and
second switches configured to receive the second distribution selection signal and connected to the second output channels.

21. The display device of claim 20, wherein the first switches are configured to be turned on in response to the first distribution selection signal,
the first output channels are configured to output the data signal to the first data connection lines,
the second switches are configured to be turned on in response to the second distribution selection signal, and
the second output channels are configured to output the data signal to the second data connection lines.

22. The display device of claim 19, wherein the bending area includes:
a first bending area through which the first data connection lines, the second data connection lines, and the first power connection lines pass; and
a second bending area through which the first data connection lines, the second data connection lines, and the second power connection lines pass.

23. The display device of claim 22, wherein in the first bending area, a number of the first power connection lines positioned between one of the first data connection line groups and one of the second data connection line groups adjacent to each other is constant.

24. The display device of claim 22, wherein in the second bending area, a number of the second power connection lines positioned between one of the first data connection line groups and one of the second data connection line groups adjacent to each other is constant.

25. The display device of claim 19, further comprising:
data lines connected to pixels in the display area and extending in the first direction; and
fan-out lines in the first peripheral area on the substrate and connected to the data lines,
wherein the fan-out lines have a straight portion extending in the first direction.

26. The display device of claim 19, wherein the first data connection lines, the second data connection lines, the first power connection lines, and the second power connection lines are on a same layer.

27. The display device of claim 19, wherein the first data connection lines, the second data connection lines, the first power connection lines, and the second power connection lines include a same material as each other.

28. The display device of claim 19, wherein the first data connection lines, the second data connection lines, the first power connection lines, and the second power connection lines are spaced apart from each other in a second direction intersecting the first direction.

* * * * *